(12) United States Patent
Ogino et al.

(10) Patent No.: US 7,935,472 B2
(45) Date of Patent: May 3, 2011

(54) PHOTO-CURABLE RESIN COMPOSITION AND A METHOD FOR FORMING A PATTERN USING THE SAME

(75) Inventors: Masahiko Ogino, Hitachi (JP); Ken Sawabe, Hitachi (JP); Makoto Kaji, Hitachi (JP); Hanako Yori, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 46 days.

(21) Appl. No.: 11/523,559

(22) Filed: Sep. 20, 2006

(65) Prior Publication Data

US 2007/0065757 A1   Mar. 22, 2007

(30) Foreign Application Priority Data

Sep. 20, 2005   (JP) .................................. 2005-272756

(51) Int. Cl.
G03F 7/00 (2006.01)
G03F 7/26 (2006.01)

(52) U.S. Cl. ............... 430/270.1; 430/281.1; 430/286.1; 430/306; 427/508

(58) Field of Classification Search .................. 430/311, 430/302; 427/508
See application file for complete search history.

(56) References Cited

U.S. PATENT DOCUMENTS

| | | | |
|---|---|---|---|
| 5,259,926 A | 11/1993 | Kuwabara et al. | |
| 5,772,905 A | 6/1998 | Chou | |
| 2001/0036591 A1* | 11/2001 | Schulz et al. | 430/270.1 |
| 2001/0051229 A1* | 12/2001 | Witt | 427/508 |
| 2005/0084613 A1* | 4/2005 | Wang et al. | 427/282 |
| 2005/0153230 A1* | 7/2005 | Koyanagi et al. | 430/270.1 |
| 2006/0214326 A1* | 9/2006 | Kim et al. | 264/225 |
| 2007/0160937 A1* | 7/2007 | Ogino et al. | 430/311 |

FOREIGN PATENT DOCUMENTS

| | | | |
|---|---|---|---|
| JP | 07-072624 | | 3/1995 |
| JP | 2000-063450 | | 2/2000 |
| JP | 2000-63450 A | * | 2/2000 |
| JP | 2004-292801 | | 10/2004 |
| WO | WO 96/11239 | | 4/1996 |
| WO | WO 01/85812 A1 | * | 11/2001 |

OTHER PUBLICATIONS

Japanese Official Action (Notice of Rejection) issued Oct. 27, 2009, for Application No. 2005-272756.
Appl. Phys. Lett. 67 (21). Nov. 20, 1995 pp. 3114-3116.

* cited by examiner

*Primary Examiner* — Shean C Wu
*Assistant Examiner* — Chanceity N Robinson
(74) *Attorney, Agent, or Firm* — Antonelli, Terry, Stout & Kraus, LLP.

(57) ABSTRACT

Provided is a new photo-curable resin composition which can be used in a photo nanoimprinting technology available for a photo nanoimprinting technology by which a substrate is processed with high accuracy. The photo-curable resin composition contains a photo-curable resin material essentially containing a (meth)acrylate, a reactive diluent, and a photo initiator. Preferably, the (meth)acrylate has a structure containing a benzene ring structure in its skeleton.

9 Claims, 3 Drawing Sheets

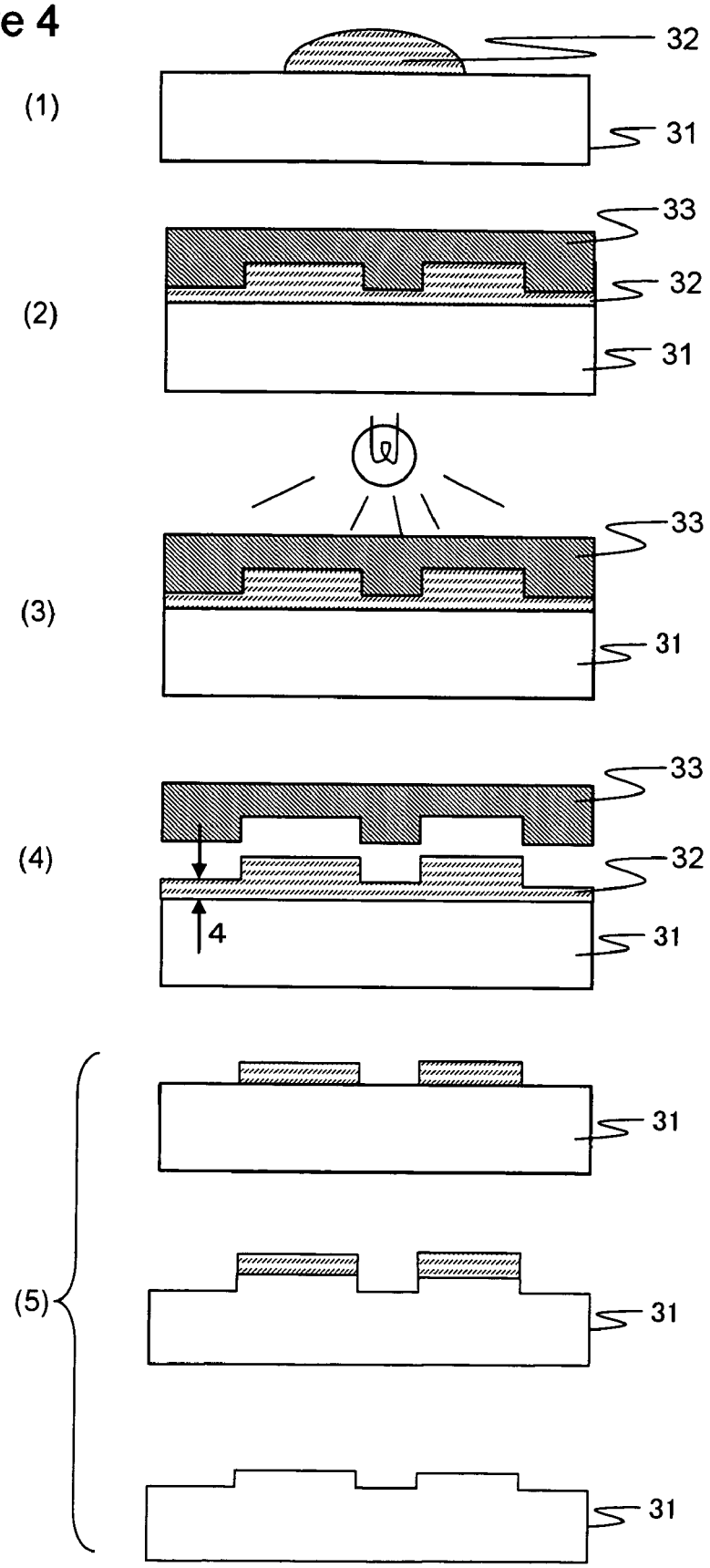

PHOTO-CURABLE RESIN COMPOSITION AND A METHOD FOR FORMING A PATTERN USING THE SAME

BACKGROUND OF THE INVENTION

1. Field of the Invention

The present invention relates to a photo-curable resin composition used to form a pattern on a substrate, and relates to a method for forming a pattern using the same.

2. Description of the Related Art

In recent years, a semiconductor integrated circuit has increasingly been made finer, and more densely integrated. To put a fine processing technology required for this purpose into practice, high accuracy photolithography equipment has been developed as a pattern transfer technology. The processing accuracy, however, has become close to the wavelength of the light source for light exposure, and thus the photolithography technology has become close to its technical limitation. As a result, instead of the photolithography technology, an electron beam drawing device, which is a type of charged particle beam device, has been used to make the processing more accurate and to fabricate a finer semiconductor integrated circuit.

In a pattern formation using an electron beam that is carried out by drawing a mask pattern, unlike in the case of a one-shot exposure method of pattern formation using a light source such as i-ray and excimer laser, there is a disadvantage that a larger number of patterns to be drawn requires a longer time of exposure (drawing), which means a longer time to form a pattern. Now the memory capacity becomes larger and larger, from 256 megabyte to 1 gigabyte and then to 4 gigabyte. This requires a drastic increase of the degree of integration, which makes the pattern density higher. A pattern with a higher density requires drastically longer time to form the pattern. Thus, a drastically lowered throughput becomes a cause for concern. In such circumstances, to increase the drawing speed of the electron beam drawing device, a one-shot irradiation drawing method has been developed. The one-shot irradiation drawing method makes it possible to form a pattern having a complicated shape, by one-shot irradiating an electron beam on the combined masks having various shapes. As a result, while a finer pattern has been made possible, the development of a large-sized and complicated electron beam drawing device has been required. This results in a disadvantage, which is an increased production cost of the device.

On the other hand, a low-cost technology for forming a fine pattern is disclosed in United State Patent Application Publication No. 5259926 (hereinafter U.S. Pat. No. 525,926), United State Patent Application Publication No. 5772905 (U.S. Pat. No. 5,772,905), S. Y. Chou et al., *Appl. Phys. Lett.*, Vol. 67, p. 3114 (1995), and the like. In this technology, a predetermined pattern is transferred by pressing a mold having concaves and convexes arranged in the same pattern as the pattern to be formed on the substrate onto the resin film layer formed on the surface of the substrate onto which the pattern is transferred. In particular, according to the nanoimprinting technology described in U.S. Pat. No. 5,772,905 and S. Y. Chou et al., a fine structure having a fineness of not more than 25 nm can be formed by a transfer method using a silicon wafer as a mold.

The nanoimprinting technology is roughly classified into two types based on the kind of transfer receiving materials. One is a thermal nanoimprinting technology in which a transfer receiving material is heated, plastically deformed, and then cooled to form a pattern. The other is a photo nanoimprinting technology in which, after a liquid photo-curable resin is applied onto the substrate at room temperature, an optically transparent mold is pressed onto the applied resin layer, and then light is irradiated to cure the resin on the substrate, and thus, a pattern is formed. Since the pattern is formed at room temperature in the photo nanoimprinting technology, the strain caused by the difference in coefficient of linear thermal expansion between the substrate and the mold tends to be small in this technology. Thus, the photo nanoimprinting technology can be used to form a high accuracy pattern. As a result, the photo nanoimprinting technology gets a lot of attention as an alternative to the lithography technology for semiconductor and the like. As a photo-curable resin used in the photo nanoimprinting technology, PAK-01 (Toyo Gosei Co. Ltd.) is introduced in Yuichi Kurashima, *Jpn. J. Appl. Phys.* Vol. 42, p. 3871.

In addition, as a photo-curable resin containing acrylate, a reactive diluent, a photo reaction initiator, and a fluorochemical surfactant, a photo solder resist material is disclosed in WO No. 96-11239 and Japanese Unexamined Patent Application Publication No. Hei 7-72624 (JP 7-72624 A). The photo solder resist material has a large precure tolerance and excellent stability subsequent to precuring, and can be developed by alkali solution.

However, the photo-curable resin described in WO No. 96-11239 and JP 7-72624 A is used in patterning by the photolithography method. In the photolithography method, the patterning is done by using, in developing, the difference in solubility caused by the contrast between the area irradiated with the light and the area not irradiated. For this reason, the photo-curable resin formed on the substrate usually is cured to form a film by being pre-baked to remove the solvent after the photo-curable resin is applied onto the substrate. In photo nanoimprinting technology, however, the liquid photo-curable resin is applied onto the substrate at room temperature, and is flowed to the concave and convex portions of the mold by pressing the mold onto the liquid photo-curable resin. And then light exposure is performed to cure the photo-curable resin, and thereby a pattern is formed. Therefore, it is difficult to apply the photo-curable resin disclosed in WO No. 96-11239 and JP 7-72624 A as a resin for the photo nanoimprinting.

In addition, in a case where a high accuracy shape is patterned by photo nanoimprinting method, it is very important to make the photo-curable resin layer on the substrate as thin as possible. In other words, when the substrate is etched by dry etching method, or the like, unnecessary etching may be performed in the patterned area unless the film of the photo-curable resin is made as thin as possible in the area to be etched. This unnecessary etching may result in a reduction in patterning accuracy.

In Y. Kurashima, the photo-curable resin PAK-O1 is applied onto a quartz substrate, and then the pattern of a Si mold is transferred thereon by irradiating the light from the side of the quartz substrate while the Si mold being pressed to the resin. However, the use of the pattern formed on the photo-curable resin PAK-O1 for the purpose of processing the substrate after transferring the pattern of the Si mold to the photo-curable resin is not examined in Y. Kurashima.

SUMMARY OF THE INVENTION

The above situation being taken into consideration, an object of the present invention is to provide a new photo-curable resin composition available for a photo nanoimprinting technology by which a substrate is processed with high accuracy, and to provide an etching method using the resin composition.

The photo-curable resin composition according to the present invention which has achieved the object described above contains the photo-curable resin material containing (meth)acrylate as the main content, a reactive diluent, and photo initiator. In the photo-curable resin composition according to the present invention, the (meth)acrylate preferably has the structure containing benzene ring structure in the skeleton, and more preferably is a structure shown in the structural formula 1 described below.

[Chemical formula 1]

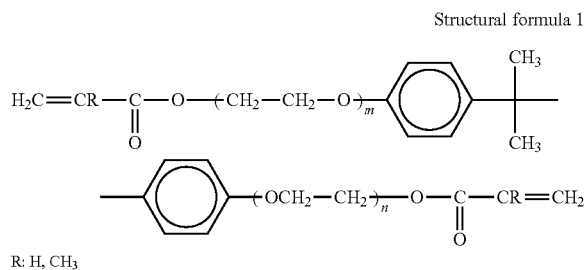

Structural formula 1

R: H, CH$_3$

In the structural formula 1, the value of m+n preferably is 4<m+n<17, more preferably m+n=10. In addition, in the photo-curable resin composition according to the present invention, the photo-curable resin material may contain a mixture of a plurality of (meth)acrylates. Specifically, tripropylene diol (meth)acrylate, and/or neopentyl glycol di(meth)acrylate can be cited as the photo-curable resin material.

The viscosity of the photo-curable resin composition according to the present invention preferably is equal to or less than 20 mPa·s. In addition, the photo-curable resin composition according to the present invention preferably has a dry etching rate of equal to or less than 2 nm/s.

The pattern formation method according to the present invention comprises a step of forming the film of the photo-curable resin composition according to the present invention, and a step of curing the film by irradiating the light. In the step of curing the film, a mold having a surface on which a pattern is formed is used, and the pattern-formed surface of the mold is brought into contact with the surface of the film formed of the photo-curable resin composition before the light irradiation.

Furthermore, the fine structure according to the present invention is obtained using a mold having a surface on which a pattern is formed. The pattern-formed surface of the mold is brought into contact with the surface of the film formed of the photo-curable resin composition according to the present invention. Then, the film is cured by irradiation of light.

Still furthermore, the etching method according to the present invention comprises a step of forming the film of the photo-curable resin composition according to the present invention on the substrate, a step of curing the film by irradiating the light and a step of etching the cured film and the substrate. In the step of curing the film, a mold having a pattern-formed surface is used, and the pattern-formed surface of the mold is brought into contact with the surface of the film formed of the photo-curable resin composition before the light irradiation.

According to the present invention, a photo-curable resin composition is provided by using the photo-curable resin material according to the present invention. The photo-curable resin composition has a very low viscosity, can be formed in a form of thin film, and is highly resistant to dry etching. Use of the photo-curable resin composition according to the present invention makes it possible to process a substrate with high accuracy by means of the photo nanoimprinting technology.

BRIEF DESCRIPTION OF THE DRAWINGS

FIGS. 4(1) to 4(5) illustrate the processes of forming fine structures on a substrate using the photo-curable resin material according to the present invention.

DETAILED DESCRIPTION OF THE PREFERRED EMBODIMENTS

Figure 1:
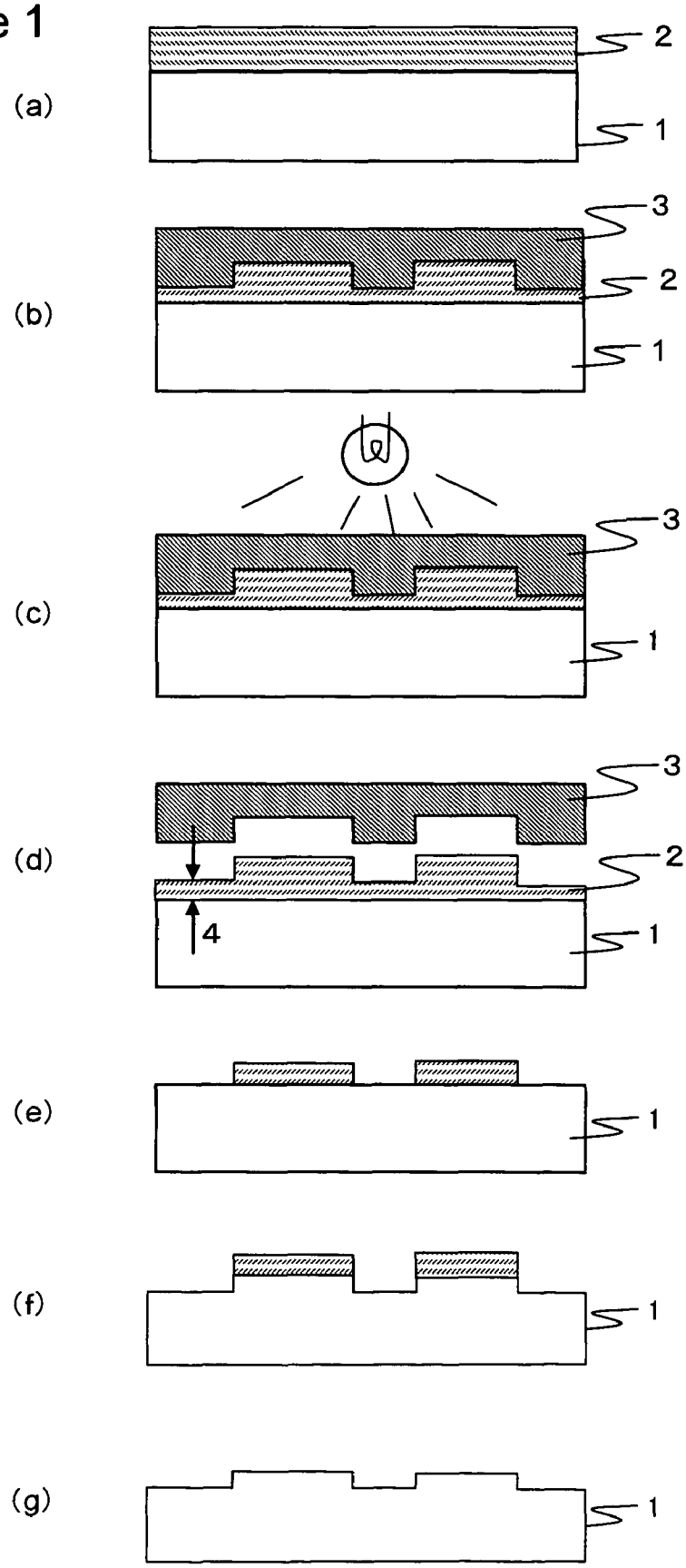
FIGS. 1(a) to 1(g) illustrate the processes of the photo nanoimprinting method using the photo-curable resin composition according to the present invention.

The present invention will be hereinafter described in detail.

Examples of a (meth)acrylate material used in the photo-curable resin composition according to the present invention are as follows, but are not limited to these substances: phenoxy glycol (meth)acrylate; phenoxy ethyleneglycol (meth)acrylate; phenoxy polyethyleneglycol (meth)acrylate; methoxy triethyleneglycol (meth)acrylate; methoxy polyethyleneglycol (meth)acrylate; behenyl (meth)acrylate; isobornyl (meth)acrylate; octoxy polyethyleneglycol (meth)acrylate; 2-hydroxy-3-phenoxypropyl (meth)acrylate; isostearyl (meth)acrylate; lauryl (meth)acrylate; polyethyleneglycol di(meth)acrylate; ethoxylated bisphenolA di(meth)acrylate; propoxylated bisphenolA di(meth)acrylate; 1,10-decanediol di(meth)acrylate; cyclodecane dimethanol di(meth)acrylate; ethoxylated 2-methyl-1,3-propane diol di(meth)acrylate; neopentylglycol di(meth)acrylate; 2-hydroxy-3-acryloxypropyl (meth)acrylate; propoxylated ethoxylated bisphenolA di(meth)acrylate; 1,6-hexane diol di(meth)acrylate; 1,9-nonan diol di(meth)acrylate; dipropyleneglycol diacrylate; tripropyleneglycol di(meth)acrylate; polypropyleneglycol di(meth)acrylate; ethyleneglycol di(meth)acrylate; diethyleneglycol di(meth)acrylate; triethyleneglycol di(meth)acrylate; tetraethyleneglycol di(meth)acrylate; ethoxylated isocyanuric acid triacrylate; ethoxylated trimethylolpropane tri(meth)acrylate; trimethylolpropane tri(meth)acrylate; propoxylated trimethylolpropane triacrylate; pentaerythritol triacrylate; ethoxylated pentaerythritol tetra(meth)acrylate; ditrimethylolpropane tetra(meth)acrylate; propoxylated pentaerythritol tetra(meth)acrylate; pentaerythritol tetra(meth)acrylate; and dipentaerythritol hexa(meth)acrylate.

For the photo-curable resin composition according to the present invention, any (meth)acrylate material having an acrylate group or a methacrylate group at the end of its molecular chain can be used. In particular, a (meth)acrylate material having a benzene ring in the molecular chain of these (meth)acrylate materials is preferable because of its excellent resistance to dry etching. Ethoxylated bisphenolA di(meth)acrylate is particularly preferable as the (meth)acrylate material, and further preferable is the one having 4 to 17 units of ethoxy group in the structure because of its low viscosity. These (meth)acrylate materials can be applied either singularly, or a plurality of (meth)acrylates can be applied in combination. In addition to the above monomers, a (meth)acrylate oligomer, which is a polymer of these monomers, can be applied.

As a reactive diluent used in the photo-curable resin composition according to the present invention, the following substances can be applied: N-vinyl pyrrolidone; acryloyl morpholine; N,N-dimethylacrylamide; N-methylolacrylamide; and N,N-dimethylaminopropylacrylamide.

Also, such a (meth)acrylate monomer having low viscosity as follows can be used: tripropylene diol (meth)acrylate; neopentylglycol di(meth)acrylate; and ethyleneglycol dimethacrylate.

These can be used either singularly or in combination. Among these substances, N-vinyl pyrrolidone is particularly preferable as a reactive diluent because of its low viscosity. The ratio of the reactive diluent to (meth)acrylate preferably is a high weight ratio in consideration of the preparation of a low viscosity solution.

The following substances are examples of the photo initiator used in the photo-curable resin composition according to the present invention: 2,2-dimethoxy-1,2-diphenylethane-1-on; 1-hydroxy-cyclohexyl-phenyl-ketone; 2-hydroxy-2-methyl-1-phenyl-propane-1-on; benzophenone; 1-[4-(2-hydroxyethoxy)-phenyl]-2-hydroxy-2-methyl-1-propane-1-on; 2-methyl-1[4-(methylthio)phenyl]-2-moripholinopropane-1-on; 2-benzil-2-dimethylamino-1-(4-morpholinophenyl)-butanon-1; bis(2,6-dimethoxybenzoil)-2,4,4-trimethyl-pentylphosphineoxide; 2-hydroxy-2-methyl-1-phenyl-propane-1-on; bis(2,4,6-trimethylbenzoil)-phenylphosphineoxide; and bis(η5-2,4-cyclopentadiene-1-yl)-bis(2,6-difluoro-3-(1H-pyrol-1-yl)-phenyl)titanium.

These photo initiators can be used either singularly or in combination of two or more of them. In addition, these photo initiators can be applied in combination with a heretofore known photopolymerization accelerator, a sensitizer, and the like. The photo initiator of the present invention is preferably blended in a ratio of 0.1 wt % to 5.0 wt %.

The photo-curable resin composition according to the present invention may contain a fluorochemical surfactant. A perfluoroalkyl-containing oligomer and the solution of the perfluoroalkyl-containing oligomer dissolved with a solvent can be used as a fluorochemical surfactant. A substance having perfluoroalkyl chain to which a hydrocarbon chain is bonded can also be used as a fluorochemical surfactant. In addition to these, substances having a structure in which an ethoxy chain or methoxy chain is bonded to the perfluoroalkyl chain can be used as a fluorochemical surfactant. Furthermore, a substance having a structure in which siloxane is bonded to these perfluoroalkyl chains can be used as a fluorochemical surfactant. As the fluorochemical surfactant, a commercially available fluorochemical surfactant can also be used. The fluorochemical surfactant can be applied in an adding ratio of 0.01 wt % to 1 wt % of the total weight.

The photo-curable resin composition according to the present invention contains the above (meth)acrylates, the above reactive diluents, and the above photo initiators as the main components. When necessary, additives, such as a small amount of an organic solvent, an adhesion provider including a silane coupling agent, a polymerization inhibiter including hydroquinone, hydroquinone monomethylether, pyrogallol, and the like may be added to the photo-curable resin composition.

The photo-curable resin composition according to the present invention, which is constructed in the above-described manner, can be used in the fine-processing of substrates by the nanoimprinting technology. The processes of this case are shown in FIGS. 1(a) to 1(g). First, as shown in FIG. 1(a), a photo-curable resin composition 2 is applied onto a substrate 1. Then, as shown in FIG. 1(b), a mold 3 having a surface on which fine patterns are formed is pressed onto the surface of the photo-curable resin. Subsequently, as shown in FIG. 1(c), an ultraviolet ray is irradiated from above the mold 3 to cure the photo-curable resin 2. Then, as shown in FIG. 1(d), the mold 3 is demolded from the photo-curable resin 2. As shown in FIG. 1(e), a base layer 4 is removed. As shown in FIG. 1(f), the substrate 1 is processed by etching with the photo-curable resin composition 2 being used as a mask. Then, as shown in FIG. 1(g), the photo-curable resin composition 2 on the substrate 1 is removed. Through the above processes fine patterns are formed on the surface of the substrate using the photo nanoimprinting technology.

With respect to the film thickness h of a resin, sandwiched between two flat plates and being compressed, the following relational expression 1 is known as a Stephan equation.

$$h = H/\sqrt{((t/\tau)+1)}, \tau = 3\mu S/(2\pi PH^2) \quad \text{Relational expression 1}$$

(H: initial film thickness, t: compression time, μ: viscosity, S: compression area, P: compression pressure)

The relational expression 1 clearly shows that it is useful to have a small initial film thickness H, or a low viscosity μ of the resin, in order to have a thin base layer (film thickness of the convex portion of the compressed resin). It is possible to reduce the viscosity of the photo-curable resin according to the present invention down to 20 mPa·s or lower. This makes it possible to make the base layer 4 thin in the process described above. In contrast, the conventional photo-curable resin composition PAK-01 has a viscosity of 72 mPa·s. After the PAK-01 is applied by the spin coating method to form a coated film, a mold having a depth of 0.1 μm is pressed and light irradiation is performed. The resultant base layer 4 has a thickness of about 2 μm. In this case, if the height of the pattern is 0.1 μm, the pattern disappears during the removal of the base layer 4. Therefore, the conventional photo-curable resin composition cannot be used as a resist mask for the processing of substrates.

Also, the photo-curable resin composition according to the present invention allows an etch rate of dry etching to be 2 nm/s or less. In this case, the photo-curable resin composition according to the present invention is quite competent to be used as a resist mask in the process where the above-mentioned dry etching method is employed. Thus, a fine processing can be performed on the substrate.

EXAMPLES

The present invention will be hereinafter described in more detail using examples. The technological scope of the present invention is not limited to the examples below. Note that a "part" and a "%" are hereinafter used on a weight basis unless otherwise indicated.

Measurement of Film Thickness

After dropping 1 g of a sample on a 4-inch silicon wafer, a preliminary spinning process was performed at 500 rpm for 10s. Subsequently, a main spinning process was performed at 3000 rpm for 90s. Then, an ultraviolet ray having a wavelength of 365 nm was irradiated at 5 J/cm² to form a resin film in an inert atmosphere for the purpose of preventing inadequate curing due to oxygen inhibition. The part of the cured film was removed by a cutter or the like to measure the difference in level between the substrate and the surface of the cured film using a profilometer (available from Tencor Co., Ltd.), and the result of measurement was defined to be the thickness of the film.

Measurement of Viscosity

Using an E-type viscometer (available from Tokyo Keiki Co., Ltd.), 1.2 cc of an evaluation sample was poured into the sample cup. Then, the sample cup was mounted to the body, and the rotor was turned to measure the viscosity. The measurements of the viscosity were performed at 23° C.

Evaluation of the Etching Rate

After forming a resin film by the same method as the method of forming a resin film in the case of the measurement of the film thickness, a sample, a part of which was masked by a polyimide adhesive tape, was prepared. Then, after being introduced into the process chamber of a dry etcher (available from Nikko Seiki Co., Ltd.), the sample was processed for 60 seconds under the condition of a flowing $CF_4$ gas at 10 ml/min, a pressure of 0.4 Pa, and an output of 250 W. Subsequently, the masking tape was removed. The etching rate was evaluated by measuring the difference in level between the surface of the processed area and that of unprocessed area.

Preparation Method

1. Weighing a photo reaction starter and a reactive diluent.
2. Putting the photo reaction starter into the reactive diluent and stirring the mixture till the starter being dissolved.
3. Weighing a (meth)acrylate material, and then pouring it into the mixture.
4. Weighing a fluorochemical surfactant, and then putting it into the mixture.
5. Stirring the mixture by a mixing rotor for 1 hour.
6. Stirring the mixture in an ultrasonic water bath for 5 minutes.
7. Filtering it with a 0.2-µm membrane filter.

Example 1

A photo-curable resin composition was prepared by blending 30 parts of Ebecryl® 605 (available from UCB Chemicals) as a (meth)acrylate material, 70 parts of N-vinylpyrrolidone as a reactive diluent, 5 parts of IRGACURE® I-907 (available from Ciba Specialty Chemicals Inc.) as a photo initiator, and 0.1 parts of MEGAFACE® R-08 (available from Dainippon Ink and Chemicals, Inc.) as a fluorochemical surfactant. The viscosity, the film thickness, and the etching rate of this composition were evaluated. The results are shown in Table 1.

Example 2

A photo-curable resin composition was prepared by blending 20 parts of Ebecryl® 605 as a (meth)acrylate material, 80 parts of N-vinylpyrrolidone as a reactive diluent, 5 parts of IRGACURE® I-907 as a photo initiator, and 0.1 parts of MEGAFACE® R-08 as a fluorochemical surfactant. The viscosity, the film thickness, and the etching rate of this composition were evaluated. The results are shown in Table 1.

Example 3

A photo-curable resin composition was prepared by blending 10 parts of Ebecryl® 605 as a (meth)acrylate material, 90 parts of N-vinylpyrrolidone as a reactive diluent, 5 parts of IRGACURE® I-907 as a photo initiator, and 0.1 parts of MEGAFACE® R-08 as a fluorochemical surfactant. The viscosity, the film thickness, and the etching rate of this composition were evaluated. The results are shown in Table 1.

Example 4

A photo-curable resin composition was prepared by blending 30 parts of a (meth)acrylate agent that is a monomer having a structure formula 1 in which m+n is 10 as a (meth)acrylate material, 70 parts of N-vinylpyrrolidone as a reactive diluent, 5 parts of IRGACURE® I-907 as a photo initiator, and 0.1 parts of MEGAFACE® R-08 as a fluorochemical surfactant. The viscosity, the film thickness, and the etching rate of this composition were evaluated. The results are shown in Table 1.

Example 5

A photo-curable resin composition was prepared by blending 10 parts of a (meth)acrylate agent that is a monomer having a structure formula 1 in which m+n is 10 as a (meth)acrylate material, 90 parts of N-vinylpyrrolidone as a reactive diluent, 5 parts of IRGACURE® I-907 as a photo initiator, and 0.1 parts of MEGAFACE® R-08 as a fluorochemical surfactant. The viscosity, the film thickness, and the etching rate of this composition were evaluated. The results are shown in Table 1.

Example 6

A photo-curable resin composition was prepared by blending 30 parts of a (meth)acrylate agent that is a monomer having a structure formula 1 in which m+n is 10 as (meth)acrylate material, 70 parts of ethylene glycol dimethacrylate as a reactive diluent, 5 parts of IRGACURE® I-907 as a photo initiator, and 0.1 parts of MEGAFACE® R-08 as a fluorochemical surfactant. The viscosity, the film thickness, and the etching rate of this composition were evaluated. The results are shown in Table 1.

Example 7

A photo-curable resin composition was prepared by blending 10 parts of a (meth)acrylate agent which is a monomer having a structure formula 1 in which m+n is 10 as a (meth)acrylate material, 90 parts of ethylene glycol dimethacrylate as a reactive diluent, 5 parts of IRGACURE® I-907 as a photo initiator, and 0.1 parts of MEGAFACE® R-08 as a fluorochemical surfactant. The viscosity, the film thickness, and the etching rate of this composition were evaluated. The results are shown in Table 1.

Example 8

Using the photo-curable resin material described in Example 5, fine structures were formed on a substrate by the following method. (1) A resin film of 80-nm thickness was formed by performing a spin coating at 7000 rpm for 90 seconds after dropping 1 cc of the photo-curable resin material described in Example 5 on a 4 inch silicon wafer. (2) A quartz mold of 1 cm square having fine holes that are formed thereon in a pattern and each of which holes has a diameter of 50 nm and a depth of 100 nm, was pressed onto the photo-curable resin at a pressure of 5 kgf/cm². (3) An ultraviolet ray was irradiated by using an ultra-high pressure mercury-vapor lamp at a rate equivalent to 5 J/cm² of a light with a wavelength of 365 nm. (4) The mold was demolded from the surface of the resin.

Figure 2:
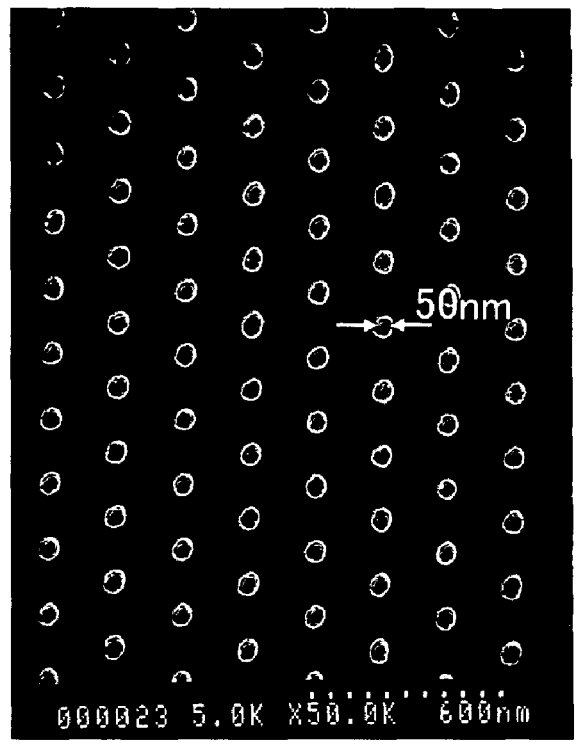
FIG. 2 is an SEM photograph of the photo-curable resin structure onto which a pattern has been transferred.

Through the processes described above, fine structures, each having a diameter of 50 nm and a height of 100 nm, were formed on the Si substrate. The thickness of the base layer was 20 nm. The SEM photograph of the surface of this sample is shown in FIG. 2.

Example 9

Figure 3:
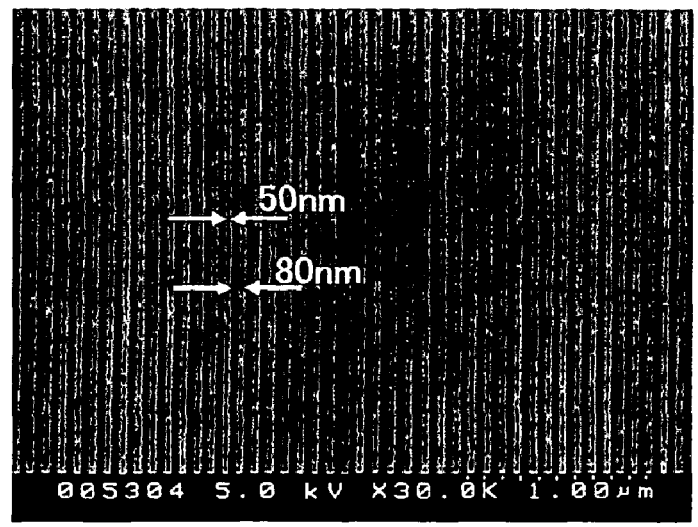
FIG. 3 is an SEM photograph of the surface of the substrate after dry etching being performed thereon.

Using the photo-curable resin described in Example 5, a track pattern was transferred onto the substrate through the processes described in Example 6 by means of a line-patterned mold having a track pitch of 80 nm. Then, after being introduced into the process chamber of a dry etcher (available from Nikko Seiki Co., Ltd.), the sample was processed for 90 seconds under the condition of flowing $CF_4$ gas at 10 ml/min, of a pressure of 0.4 Pa, and of an output of 250 W. Subsequently, the substrate was processed using an $O_2$ asher to remove the residue. The SEM photograph of the processed area is shown in FIG. 3.

Example 10

Using the photo-curable resin material described in Example 7, fine structures were formed on a substrate by using the following method as shown in FIG. 4.

(1) Droplets (3.5 μg) of a photo-curable resin material 32 described in Example 7 were dropped on a 4-inch silicon wafer 31 by discharging the photo-curable resin material 32 from a metallic nozzle having a discharge port with an inner diameter of 140 μm at a pressure of 10 KPa for 10 microseconds. (2) A quartz mold 33 of 1 cm square having fine holes that are formed thereon in a pattern and each of which has a diameter of 50 nm and a depth of 100 nm, was pressed onto the photo-curable resin at a pressure of 5 $kgf/cm^2$. (3) An ultraviolet ray was irradiated by using an ultra-high pressure mercury-vapor lamp at a rate equivalent to 5 $J/cm^2$ of a light with a wavelength of 365 nm. (4) The mold was demolded from the surface of the resin. (5) The Si substrate was dry-etched using the photo-curable pattern formed by the same method as that described in Example 9 as a mask.

The thickness of the base layer was evaluated on completion of the process (3) and the result was about 30 nm. This suggests that a smaller amount of the photo-curable resin is required to obtain an equivalent thickness of the base layer to that of the case where the transfer is carried out on the resin film formed by a spin coat method. This is because the viscosity of the resin composition of the present invention is so low that a small amount of droplets can be flowed in wide area.

Through the processes described above, fine structures each of which has a diameter of 50 nm and a height of 100 nm were formed on the surface of the Si substrate.

Comparative Example

Using PAK-01 as a photo-curable resin, the viscosity, the film thickness, and the etching rate were evaluated. The results are shown in FIG. 1.

The results shown in Table 1 reveal that the photo-curable resin composition of the present invention had a low viscosity, allowed the film to be made thinner, and made it possible to form fine structures. The results also reveal that the photo-curable resin composition of the present invention had such an excellent dry-etching resistance as to be used as a resist material for processing a substrate and to make the processing of the substrate with high accuracy.

What is claimed is:

1. A photo-curable resin composition used for photo nanoimprinting, a fine pattern being formed on a surface of the photo-curable resin composition by a process including: using a mold with a fine pattern formed thereon, bringing a surface thereof on which the pattern is formed into contact with a surface of a resin film, curing the resin film by irradiating light on the resin film; and thus forming the fine pattern on the surface of the resin film, the photo-curable resin composition comprising:
a photo-curable resin material containing (meth)acrylate having a structure shown in the structural formula 1 below:

[Chemical formula 1]

Structural formula 1

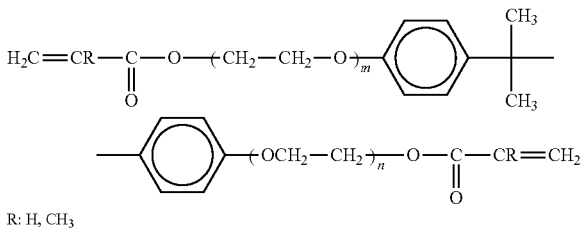

R: H, CH₃ a reactive diluent;
a photo initiator; and
a fluorochemical surfactant,
wherein a content of the reactive diluent is not less than 70 parts by weight with respect to 100 parts by weight in total of the (meth)acrylate having the structure shown in the structural formula 1 and the reactive diluent,
wherein a viscosity of the composition is 20 mPa·s or less, and
wherein the reactive diluent is selected from the group consisting of N-vinyl pyrrolidone, acryloyl morpholine, N,N-dimethylacrylamide, N-methylolacrylamide, N,N-dimethylaminopropylacrylamide, tripropylene diol

TABLE 1

|  |  | Example 1 | Example 2 | Example 3 | Example 4 | Example 5 | Example 6 | Example 7 | Comparative example |
|---|---|---|---|---|---|---|---|---|---|
| Epoxy acrylate | Ebecryl ® 605 | 30 | 20 | 10 | — | — | — | — | — |
|  | BisAacrylate | — | — | — | 30 | 10 | 30 | 10 | — |
| Diluent | N-vinylpyrrolidone | 70 | 80 | 90 | 70 | 90 | — | — | — |
|  | Ethylene glycol dimethacrylate | — | — | — | — | — | 70 | 90 | — |
| Photo initiator | IRGACURE ® I-907 | 5 | 5 | 5 | 5 | 5 | 5 | 5 | — |
| Fluorochemical surfactant | MEGAFACE ® R-08 | 0.1 | 0.1 | 0.1 | 0.1 | 0.1 | 0.1 | 0.1 | — |
| Viscosity | cP | 11.4 | 6.4 | 3.9 | 8.8 | 3.9 | 13.2 | 5.7 | 72.1 |
| Film thickness | nm | 647 | 417 | 187 | 599 | 152 | 815 | 398 | 2520 |
| Etching rate | nm/s | 1.99 | 1.96 | 1.88 | 1.98 | 1.89 | 1.88 | 1.99 | 2.68 |

(meth)acrylate, neopentylgylcol di(meth)acrylate and ethyleneglycol dimethacrylate, wherein the composition has a property that an etching rate by dry etching is 2 nm/s or less.

2. The photo-curable resin composition according to claim 1, wherein the value of m+n in the above structural formula 1 satisfies the relationship 4<m+n<17.

3. The photo-curable resin composition according to claim 1, wherein the value of m+n in the above structural formula 1 satisfies the relationship m+n=10.

4. The photo-curable resin composition according to claim 1, wherein the photo-curable resin material is the mixture of a plurality of (meth)acrylates.

5. The photo-curable resin composition according to claim 1, wherein at least a part of the photo-curable resin material and of the reactive diluent are tripropylene diol (meth)acrylate and/or neopentyl glycol di(meth)acrylate and/or ethylene glycol dimethacrylate.

6. The photo-curable resin composition according to claim 1, wherein the reactive diluent contains N-vinyl pyrrolidone.

7. A method for forming a pattern, comprising steps of:
dropping the photo-curable resin composition according to claim 1 onto a substrate, or forming a film of the photo-curable resin on the substrate;
curing the film by irradiating light after filling the photo-curable resin composition in a pattern formed on a surface of a mold, the pattern-formed surface being brought into contact with the surface of the resin composition comprised of the photo-curable resin composition; and
demolding the mold from the surface of the cured resin.

8. A fine comprising a surface on which a pattern is formed, wherein the pattern is formed of a cured product structure of the photo-curable resin composition according to claim 1.

9. A method for forming a pattern, comprising the steps of:
dropping the photo-curable resin composition according to claim 1 on a substrate, or forming a film of the photo-curable resin composition on the substrate;
curing the film by irradiating the light after filling the photo-curable resin composition in a pattern formed on a surface of a mold, the pattern-formed surface being brought into contact with the surface of the resin composition comprised of the photo-curable resin composition; and
etching the substrate using the cured film as a mask after etching a part of the cured film.

* * * * *